(12) United States Patent
Bernstein et al.

(10) Patent No.: US 7,750,677 B2
(45) Date of Patent: Jul. 6, 2010

(54) CMOS BACK-GATED KEEPER TECHNIQUE

(75) Inventors: Kerry Bernstein, Underhill, VT (US);
Andres Bryant, Burlington, VT (US);
Wilfried Haensch, Somers, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/538,652

(22) Filed: Aug. 10, 2009

(65) Prior Publication Data

US 2009/0295432 A1    Dec. 3, 2009

Related U.S. Application Data

(62) Division of application No. 12/045,500, filed on Mar. 10, 2008, now abandoned.

(51) Int. Cl.
*H03K 19/21* (2006.01)

(52) U.S. Cl. .................. 326/55; 326/54; 326/122; 327/534

(58) Field of Classification Search .......... 326/52–55, 326/104, 109, 112, 119, 121, 122; 327/534–535
See application file for complete search history.

(56) References Cited

U.S. PATENT DOCUMENTS

| | | | |
|---|---|---|---|
| 5,015,890 A | 5/1991 | Murakami et al. | |
| 5,467,050 A | 11/1995 | Clapp, III et al. | |
| 5,559,368 A | 9/1996 | Hu et al. | |
| 5,644,266 A | 7/1997 | Chen et al. | |
| 5,831,452 A | 11/1998 | Nowak et al. | |
| 6,064,263 A | 5/2000 | Nowak | |
| 6,144,227 A | 11/2000 | Sato | |
| 6,177,826 B1 * | 1/2001 | Mashiko et al. | 327/534 |
| 6,320,423 B1 | 11/2001 | Sato | |
| 6,326,666 B1 | 12/2001 | Bernstein et al. | |
| 6,462,585 B1 | 10/2002 | Bernstein et al. | |
| 6,462,595 B1 | 10/2002 | Hsu et al. | |
| 2005/0199964 A1 * | 9/2005 | Sekigawa et al. | 257/369 |
| 2007/0013413 A1 * | 1/2007 | Chiang et al. | 326/121 |
| 2007/0262793 A1 * | 11/2007 | Kapoor | 326/101 |

OTHER PUBLICATIONS

Fuse et al.,"0.5 V SOI CMOS Pass-Gate Logic",Digest of Technical Papers IEEE International Solid-State Circuits Conference; Feb. 1996; pp. 88-89; vol. 39, ULSI Research Laboratories, Toshiba Corporation, Kawasaki, Japan.

* cited by examiner

*Primary Examiner*—Rexford N Barnie
*Assistant Examiner*—Jany Tran
(74) *Attorney, Agent, or Firm*—Scully, Scott, Murphy & Presser, P.C.; Vazken Alexanian

(57) ABSTRACT

A novel methodology for the construction and operation of logical circuits and gates that make use of and contact to a fourth terminal (substrates/bodies) of MOSFET devices is described in detail. The novel construction and operation provides for maintaining such body-contacted MOSFET devices at a lower threshold voltage ($V_{Th}$) when actively on (to increase overdrive and performance), and at a higher relative threshold voltage when off (to reduce leakage power). Because the threshold potential of a gate moves inversely to its body potential, it follows then that in general, the body of a given device must be tied to the inverse of the device's drain voltage to achieve such a desirable threshold potential modulation effect for improved device, circuit, gate and logical family operation.

2 Claims, 5 Drawing Sheets

CMOS BACK-GATED KEEPER TECHNIQUE

CROSS-REFERENCE TO RELATED APPLICATIONS

This application is a divisional of U.S. patent application Ser. No. 12/045,500 filed Mar. 10, 2008.

BACKGROUND

The present invention relates to very large scale semiconductor integrated (VLSI) circuits and technology, and more particularly relates to VLSI circuitry designed with the back-gated MOSFET devices in such a way that their threshold voltages are dynamically modulated during circuit operation to realize improved logic state capture, reduced leakage current and improved noise immunity at the back-gated devices.

The need for low-power VLSI circuitry for use in numerous electronic applications is ever growing. To reduce power consumption, lower operating voltages (Vdd) and minimized device dimensions are the constant aim of IC designers. To lower the threshold voltage ($V_{Th}$) and the operational voltage for IC devices, silicon-on-oxide (SOI) MOSFETs have been developed and are known. Fuse, et al., "0.5 V SOI CMOS Pass-Gate Logic," DIGEST OF TECHNICAL PAPERS, IEEE International Solid-State Circuits Conference; vol. 39, February 1996; pp. 88-89.

SOI metal oxide field effect transistors (MOSFETs) can be fabricated into two distinct modes of operation: 1) fully depleted (FD), and 2) partially depleted (PD) channel region (i.e., body). In conventional fully depleted SOI devices, the silicon film thickness is usually less than or equal to half the depletion width of the bulk device. The surface potentials at the front and back interfaces are strongly coupled to each other and capacitively coupled to the front-gate and substrate through the front-gate dielectric and the buried oxide, respectively. Therefore, the potential throughout the silicon film, and hence the charge, is determined by the bias conditions on both the front-gate and the substrate. By using the substrate as a back-gate, the device can be operated as a dual-gated device. A back-gate may or may not have a discrete gate plate which is physically insulated from the conduction layer. Devices may be back-gated by merely contacting the device body.

Dynamic threshold metal oxide semiconductor (DTMOS) devices can be fabricated on silicon-on insulator (SOI) substrates as described, for example, in U.S. Pat. No. 5,559,368, to Hu, et al., issued Sep. 24, 1996, and incorporated by reference ("the '368 patent"). The '368 patent discloses a DTMOS device (MOSFET) fabricated on a silicon-on-insulator substrate to include a four-terminal layout comprising source, drain, gate and body contacts. The DTMOS device comprises a substrate with a buried oxide layer formed therein, and a P-SI film disposed on the oxide layer. N+ sources and drains are formed in the film. A gate electrode is formed on a gate insulation layer on the film between the source and drain of the MOSFET device. The gate and film are interconnected (gate to body) to reduce the threshold or gate turn-on voltage ($V_{Th}$) when the gate voltage is high.

The reduced threshold or turn-on voltage (V.sub.t) improves MOSFET device performance in numerous respects. When the FET is OFF, the threshold voltage is increased, reducing sub-threshold leakage currents. Applications which use DTCMOS devices provide for lower leakage currents while the MOSFET device is off, and lower threshold voltages when the device is on. In non-DTCMOS structures, the bulk silicon material from which the channel of the MOSFET device is formed is either grounded, or in many applications connected to the source region of the device.

U.S. Pat. No. 6,326,666, to Bernstein, et al., issued Dec. 4, 2001, and incorporated by reference (the '666 patent), discloses a DTCMOS circuit implemented in SOI that includes a plurality of input transistors with threshold voltages controlled by early arriving logic signals. The DTCMOS transistors have body contacts connected to the monocrystalline silicon film of the device. Use is made of the body contact for controlling the voltage threshold ($V_{Th}$) of a device that receives a respective logic signal. Earlier arriving logic signals are coupled to the gate of one input transistor, as well as to the body contact of another transistor receiving a later arriving logic signal. A data transition on the earlier arriving logic signal will lower the voltage threshold of the input transistor receiving the later arriving signal. Thus, a dynamic lowering of the voltage threshold occurs permitting an increase in speed for the logic circuit.

U.S. Pat. No. 6,462,585, to Bernstein, et al., issued Oct. 8, 2002, and incorporated by reference ("the '585 patent"), discloses an asymmetric-double-gate complementary metal oxide semiconductor (DGCMOS) device that includes a cross-coupled latch circuit to improve effective $V_{dd}/V_{Th}$. The cross-coupled latch circuit substantially reduces body-to-source/drain parasitic capacitances as well as structural body resistance parasitics of the asymmetric-DGCMOS device and improves the effective $V_{dd}/V_{Th}$ ratio without causing any substantial body-to-source/drain parasitic capacitances or structural body resistance parasitics. The DGCMOS device is scalable below about 0.1 mm, while being able to operate at voltages below about 1 V.

Delay variation and process tolerance, however, negatively affect the timing precision in deep submicron VLSI logic circuitry, even in the above-mentioned DGCMOS and DTCMOS designs. For example, complementary pass gate logic (CPL) circuits that include NFET gates in an evaluate tree tend to result in incomplete transition voltages presented at the output buffers. Incomplete transition voltages at the output buffers cause excessive crowbar current in the buffer side when it is pulled low. The excessive crowbar current tends to complicate and limit the CPL circuit family use by designers. And while dynamic logic circuits constructed with DTCMOS and DGMOS technology are very fast, the circuits are typically very large and very sensitive to leakage current. For example, in domino-based designs, separate keepers are typically used (required) to replace leakage current that could otherwise lead to corrupted logic states.

What would be desirable, therefore, in the field of DGMOS and DTCMOS IC design is a device constructed with back-gated MOSFETs to positively capture logic states, reduce leakage currents and improve noise immunity by dynamically modulating threshold voltages. Such devices would preferably be utilized in circuits whose power supply voltages exceed 0.5 V, the approximate limitation of conventional DTCMOS technologies. The skilled IC designer would further welcome such back-gated devices to comprise complementary pass-gate logic (CPL) elements to dramatically reduce crowbar currents in NFET pass gates when the buffer side is pulled low. For that matter, such a device would be further desirable in dynamic logic circuits to eliminate the need for a separate keeper device and improve overall performance.

BRIEF SUMMARY

The present invention provides novel back-gated MOSFET circuitry to positively capture logic states, reduce leakage currents and improve noise immunity by dynamically modulating threshold voltages.

Broadly, the present invention provides a novel methodology for the construction and operation of logical circuits and gates that make use of and contact to a fourth ($4^{th}$) terminal (substrates/bodies) of MOSFET devices. The novel construction and operation provides for maintaining such body-contacted MOSFET devices at a lower threshold voltage ($V_{Th}$) when actively on (to increase overdrive and performance), and at a higher relative threshold voltage when off (to reduce leakage power). Because the threshold potential of a transistor moves inversely to its body potential, it follows then that in general, the body of a given device must be tied to the inverse of the device's drain voltage to achieve such a desirable threshold potential modulation effect for improved device, circuit, gate and logical family operation.

Circuits or gates constructed to use the fourth ($4^{th}$) terminal substrate/body contact within the MOSFET devices comprising same achieve an improved or higher circuit performance when on, and a lower circuit power when off as distinguished from conventional operation wherein MOSFETs are used in such circuits and gates to merely invert the output, and tying such output to the body. As distinguished, the construction of circuits and gates in accordance with the invention requires tying or connecting a logically evaluated output of a logical gate back to the body of selected transistors in that logic gate. Conceptually, this technique can be applied to any of the prevalent circuit technologies described.

In one embodiment, the invention includes a back-gated keeper circuit and technique to minimize delay variation and improve process tolerance. The back-gated keeper circuit may be used with any power supply voltage as long as the devices include the back-gates, and the back gates are isolated from the device body.

The inventive back-gated operation may be implemented in accordance with the invention within any stated combinatory logic circuit topology by placing a minimum sized inverter on the combinatorial logic circuit output, the output of which is then arranged to drive the back gates of all circuit devices. The effect of the inverted output driving the back gates of all circuit devices is, like DTCMOS, to lower the relative threshold of the "on" device, and elevate the relative threshold of the "off" device. The result is that the "on" devices receive higher overdrive, and "off" device are clamped harder off, thereby improving noise immunity and reducing leakage.

In another embodiment, the invention includes a dynamic domino back-gated keeper circuit for use in domino logic circuits. The inventive domino logic circuit utilizes the back-gate effect to eliminate a device and improve performance in a common dynamic dynamo. In particular, a PFET precharge device is included in the domino for synchronous dynamic threshold modulation. By lowering the threshold of an "off" precharge device sufficiently, the precharge device will leak charge onto the precharge node at a rate that is necessary to replace NFET evaluate tree leakage. The skilled artisan should note that just like in conventional keeper circuit operation, the leakage current provides a measure of hysteresis. But by eliminating the need for a discrete keeper device in the domino, junction cap is eliminated along with its attendant power and area requirements in the circuit. The precharge device arranged as described requires very little current to maintain node precharge, and will develop sufficient off current.

In yet another embodiment, the invention is implemented in a back-gated complementary pass gate logic (CPL) family, wherein the use of the back-gated structure in an evaluate tree dramatically reduces crowbar current when the buffer side is pulled low. Cross-coupling the outputs of the CPL circuit onto the back-gates of the devices provides for a dynamic throttling of the CPL circuit overdrive-. The inventive design shows a marked improvement over prior art attempts, which cross-coupled the CPL outputs to the buffer side circuit input. When CPL outputs are coupled to the back-gates of the evaluate devices, circuit operation would provide for lowering the NFET threshold voltage ($V_{Th}$) instead of raising PFET $V_{Th}$.

BRIEF DESCRIPTION OF THE SEVERAL VIEWS OF THE DRAWINGS

The foregoing and other objects, aspects and advantages will be better understood from the following detailed description of embodiments of the inventions, with reference to the drawings, in which.

DETAILED DESCRIPTION

As mentioned above, the inventive back-gated operation contemplated by the invention may be implemented in any known combinatory logic circuit topology by merely placing a minimum sized inverter on the combinatorial logic circuit output, the output of which is then arranged to drive the back gates of all circuit devices. The effect of the inverted output driving the back gates of all circuit devices is, like DTCMOS, to lower the relative threshold of the "on" device, and elevate the relative threshold of the "off" device. The result is that the "on" devices are on harder, and the leakage of "off" devices is clamped harder thereby improving noise immunity.

Figure 1:
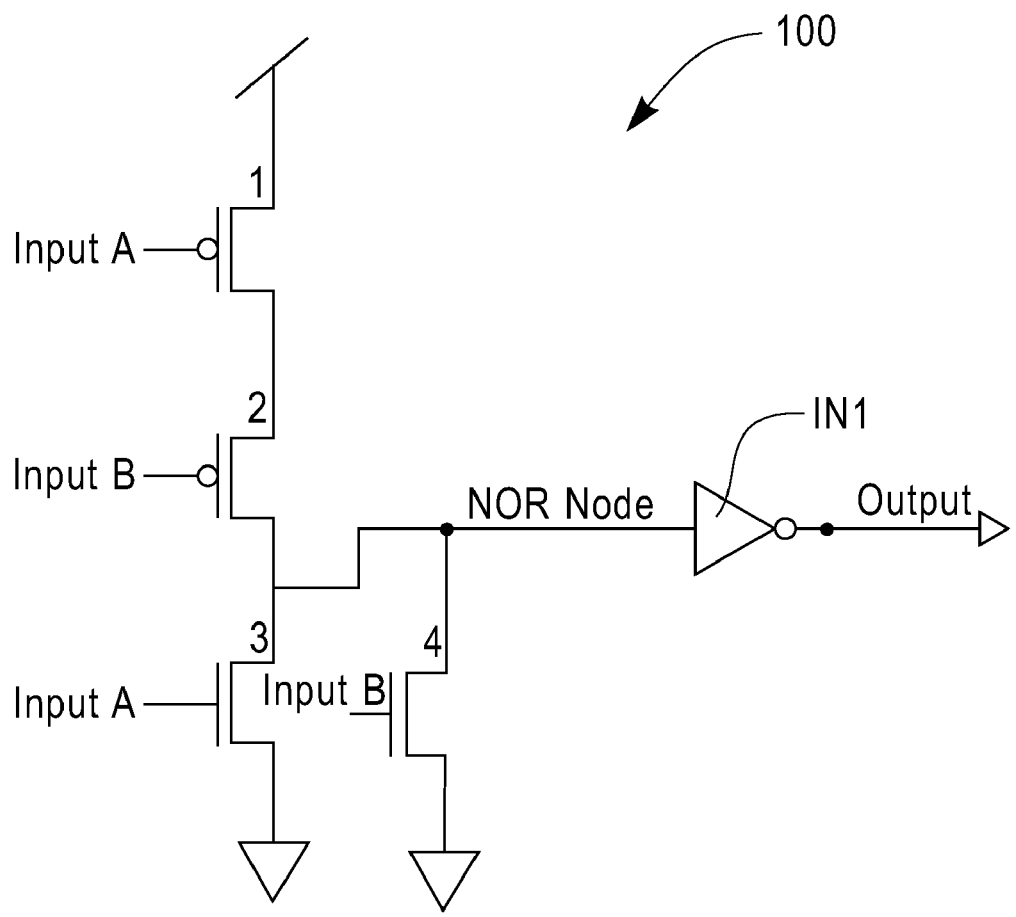
FIG. 1 is a schematic diagram of a conventional prior art two-way OR implemented in standard combinatorial CMOS.

To highlight the inventive operation, attention is directed to prior art FIG. 1, which is a schematic representation of a simple 2-way OR circuit 100 implemented in standard, static combinatorial CMOS technology. Prior art OR circuit 100 comprises a first PMOS device 1 having a gate input A, a source that may be connected to other circuits (within an IC comprising circuit 100), and a drain connected to a source of a second PMOS device 2. PMOS device 2 includes a gate input B, and a drain connected to the drain of an NMOS device 3, the input gate of which is connected gate input A of PMOS device 1. The drains of PMOS device 2 and NMOS device 3, referred to herein as a N node, are connected respectively to a drain of a second NMOS device 4, and an input of inverter device IN1. The gate of second NMOS device 4 is connected to the input B of second PMOS device 2. In bulk CMOS technologies, the bodies of the PFET devices share respective N-type well connections to the supply voltage, and the bodies of NFET devices share a common connection to the P-Type substrate; in SOI technologies bodies are assumed to float if not implemented with body contacts.

Figure 2:
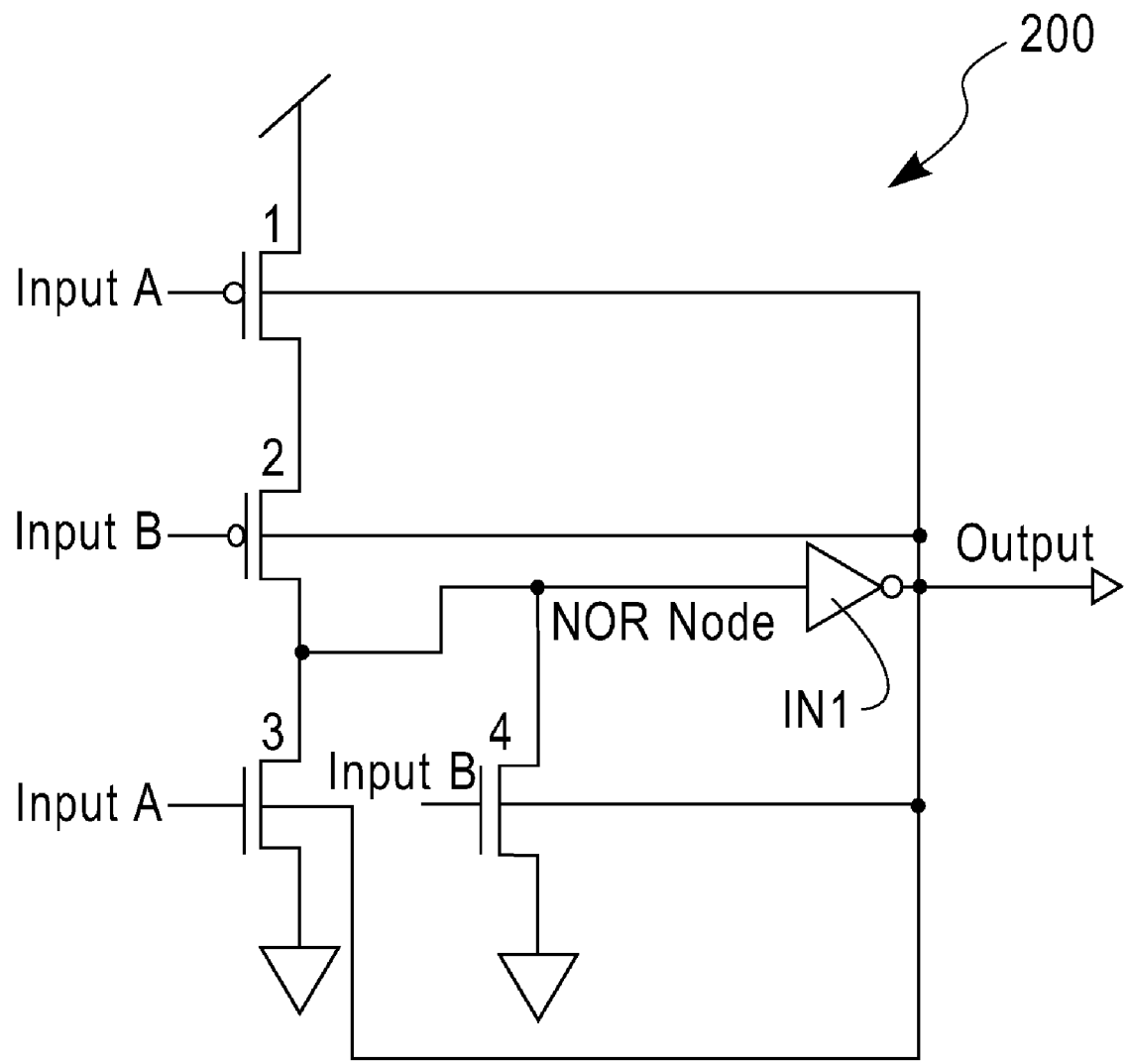
FIG. 2 is a schematic diagram of a novel back-gate keepered OR gate implemented with back-gated CMOS in accordance with the invention.

FIG. 2 is a schematic circuit diagram representing a back-gate-keepered OR circuit 200 constructed in accordance with the invention. Inventive OR circuit 200 comprises a first PMOS device 1 having a gate input A, a source that is connected to the supply and a drain connected to a source of a second PMOS device 2. PMOS device 2 includes a gate input B, and a drain connected to the drain of an NMOS device 3, the input gate of which is connected to gate input A of PMOS device 1. The drains of PMOS device 2 and NMOS device 3 are connected respectively to a drain of a second NMOS device 4, and an input of inverter device IN1, referred to as a NOR node. The gate of second NMOS device 4 is connected to the input B of second PMOS device 2. The NOR node state is inverted by the inverter IN1 as the circuit output. But in the inventive OR circuit shown, the output or inverted NOR node state is coupled back to the back-gate of all devices shown in the back-gated-keepered OR circuit 200. That is, the output of inverter IN1 is coupled back to the back-gates of PMOS devices 1, 2, and NMOS devices 3, 4.

Operation of the novel back-gated-keepered OR circuit 200 will now be described as inputs A go high and inputs B stay low. As input A rises, the NOR node falls to ground through first NMOS device 3. The output node at the inverter (IN1) output then rises, and is coupled back to the CMOS devices (1-4). The effect produced by the inventive circuit design is that the thresholds ($V_{Th}$) of NMOS devices 3, 4, become depressed, enhancing the present logical state. The threshold voltages of PMOS devices 1 and 2 become relatively higher, reducing the leakage of PMOS device 1, making its way to ground through NMOS device 3. During this transition, when the thresholds of NMOS devices 3, 4 become lowered and the thresholds of PMOS devices 1, 2, become raised, the prior state of output (on IN1) may slightly inhibit switching performance due to hysteresis effects, but essentially in exchange for much improved noise immunity, leakage current reduction and overall device and therefore circuit robustness.

Figure 3:
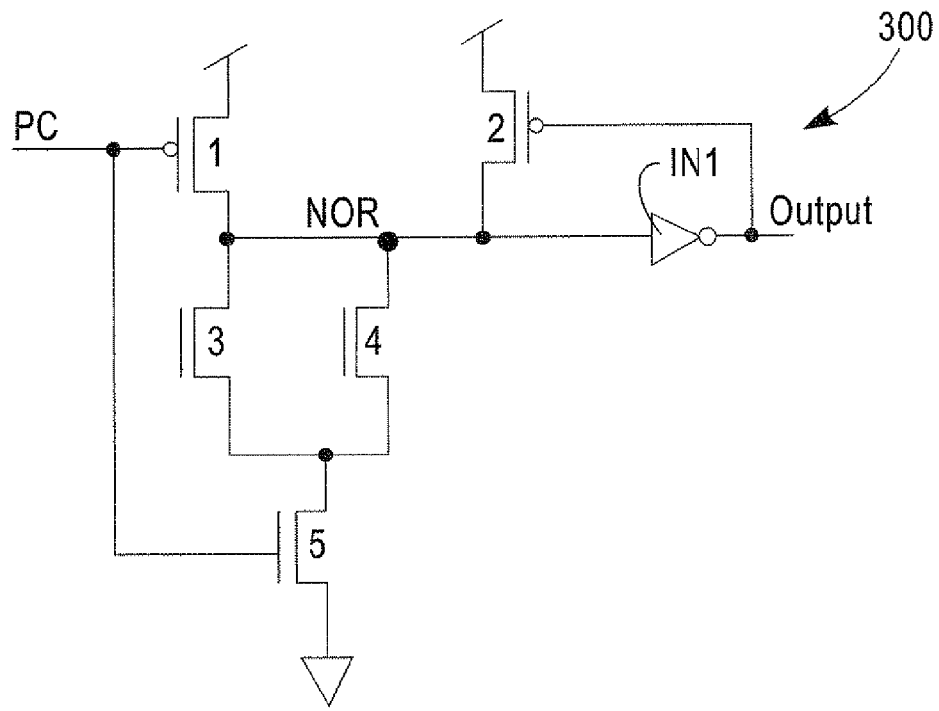
FIG. 3 is a schematic diagram of a conventional prior art two-way AND implemented in standard dynamic CMOS logic.

In another embodiment, the invention includes a dynamic domino back-gated keeper circuit for use in domino-based IC designs. To highlight the inventive operation, attention is first directed to prior art FIG. 3. FIG. 3 is a schematic circuit diagram of a conventional dynamic domino AND circuit 300 that is constructed with conventional CMOS devices. That is, first and second PMOS devices 1, 2, are connected at their sources to the voltage supply, and connected together at their drains to the drains of NMOS devices 3, 4, and to an input of inverter IN1 (referred to as the NOR node), an output of which is the AND circuit 300 output. The output is fed back to the gate of PMOS device 2. The sources of NMOS devices 3, 4, are connected to the drain of NMOS device 5, the gate of which is connected to the gate of PMOS device 1, the state of which is defined by clock signal PC. When clock input PC goes low, the AND circuit 300 enters a precharge mode, and the NOR node goes high. With the NOR node high, the second PMOS device 2 turns on to later replace charge leaking from the NOR node (after PC goes high). PMOS device 2 continues to trickle in charge unless or until NMOS devices 3, 4, are turned on during evaluate mode. When PC is high, third NMOS device 5 is on.

Figure 4:
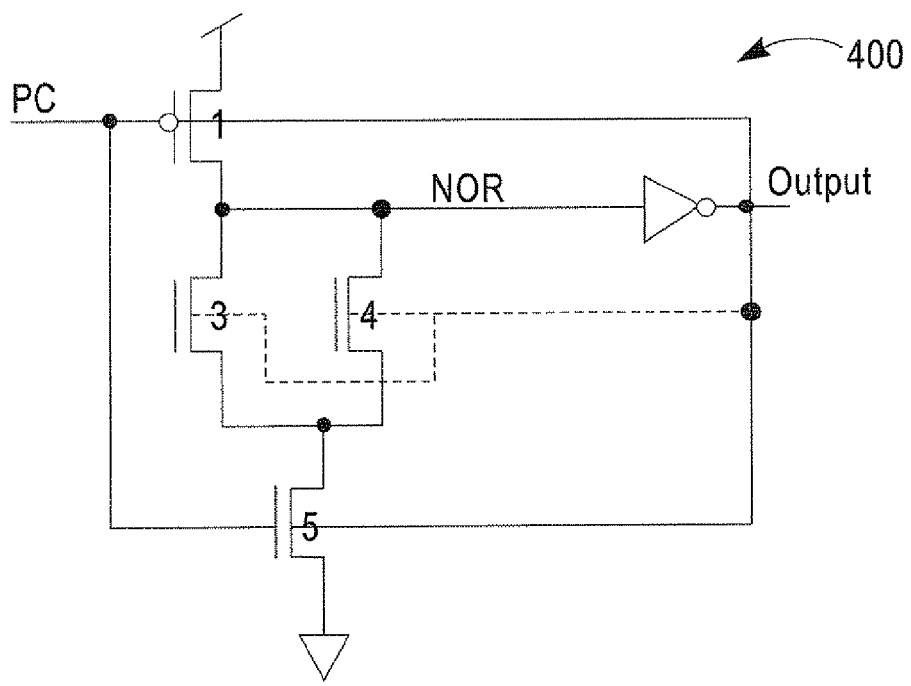
FIG. 4 is a schematic diagram of a novel back-gate-keepered dynamic domino AND gate implemented with back-gated CMOS in accordance with the invention.

The inventive domino logic circuit 400 of FIG. 4, in comparison, utilizes a back-gate effect to eliminate a device and improve performance in a common dynamic dynamo. In particular, a PFET precharge device is included in the domino for synchronous dynamic threshold modulation. By lowering the threshold of an "off" precharge device sufficiently, the precharge device will leak charge onto the precharge node at a rate that is necessary to replace NFET evaluate tree leakage. The skilled artisan should note that just like in conventional keeper circuit operation, the leakage current provides a measure of hysteresis. But by eliminating the need for a discrete keeper device in the domino, junction cap is eliminated along with its attendant power and area requirements in the circuit. The precharge device arranged as described requires very little current to maintain node precharge, and will develop sufficient off current.

That is, FIG. 4 is a schematic circuit diagram depicting a back-gate-keepered dynamic domino AND circuit 400 that utilizes back gated CMOS devices. AND circuit 400 includes a PMOS device 1 connected at its source to the voltage supply, and at its drain to the drains of NMOS devices 3, 4, and to an input of inverter IN1 (referred to as the NOR node), an output of which is the AND circuit 400 output. The sources of NMOS devices 3, 4, are connected to the drain of NMOS device 5, the gate of which is connected to the gate of PMOS device 1, the state of which is defined by clock signal PC. The output of IN1 is fed back to the back-gate of PMOS device 1 and NMOS device 5. Optionally, and preferably, the output of IN1 is also connected to the back-gates of first and second NMOS devices 3, 4.

Inventive operation of the back-gate-keepered dynamic domino AND circuit 400 is as follows. When clock input PC goes low, the AND circuit 400 enters precharge mode, and the NOR node goes high. With the NOR node high, the inverted output goes low. When the output goes low, the output signal drives the back-gate of PMOS device 1 such that its relative threshold voltage ($V_{Th}$) and increases its leakage current after turning off at completion of the charge mode. Such operation allows that the AND circuit 400 can function without a keeper device, such as the second PMOS device 2 shown in the domino circuit 300 (AND) of prior art FIG. 3. The keeper device is no longer needed. For that matter, the skilled artisan should note that such operation requires that the threshold voltage ($V_{Th}$) of PMOS device 1 of FIG. 4 be sufficiently centered so that the change in back-gate voltage during normal operation the minimum necessary keeper current under worst-case assumptions. It follows that conversely, third NMOS device 5 enters a low leakage state as its threshold voltage is coupled low.

As should be apparent from the exemplary FIG. 4 embodiment shown, NMOS devices 3, 4, and any evaluate devices implemented in accordance with the inventive concepts herein need not be double-gated devices. But where such devices are double-gated, the back-gates should be connected to the IN1 output.

Figure 5:
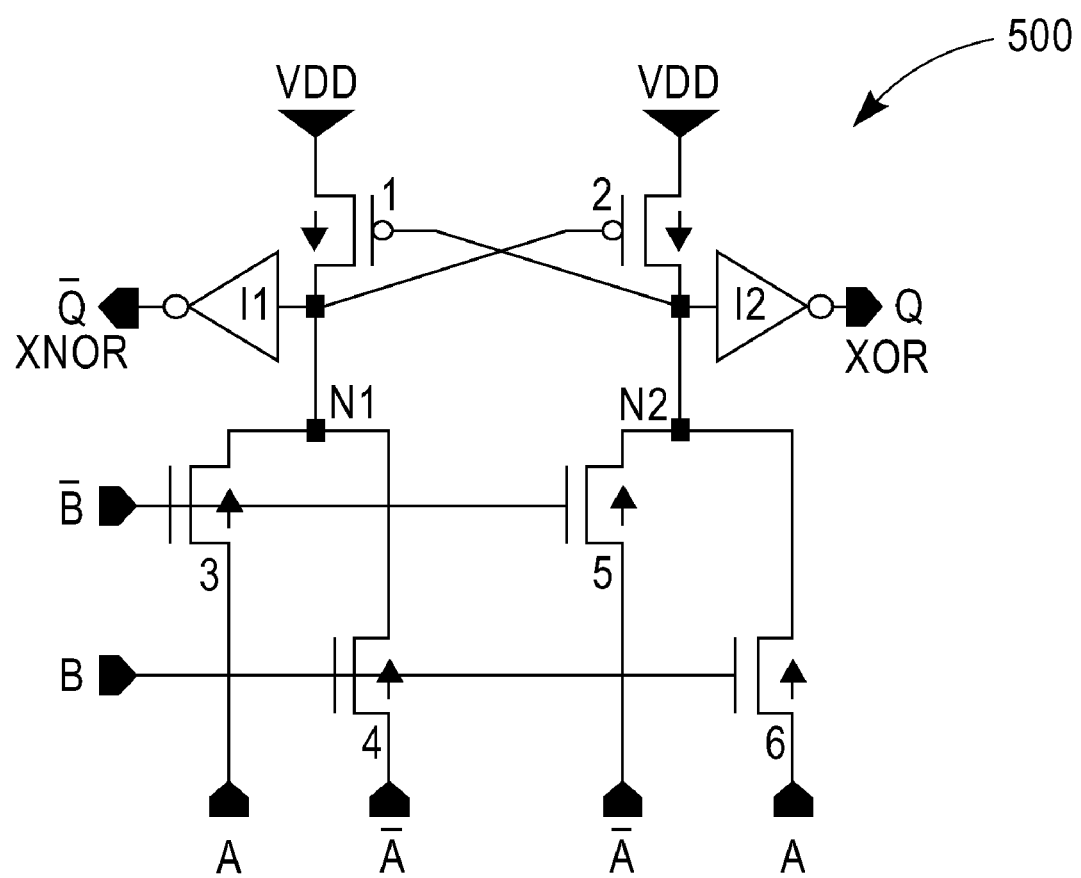
FIG. 5 is a schematic diagram of a conventional prior art cross-coupled complementary pass gate logical exclusive NOR/exclusive OR circuit in standard CPL logic.

FIG. 5 is a schematic diagram of a prior art cross-coupled complementary pass gate logical exclusive NOR/exclusive OR circuit 500 in standard CPL logic. Prior art NOR/OR circuit 500 includes PMOS devices 1, 2, sources of which are connected to Vdd, and drains of which are connected to respective inputs of first and second inverters, I1, I2, forming respective nodes N1, N2. Node N1 also connects to drains of NMOS devices 3, 4, and node N2 also connects to drains of NMOS devices 5, 6. A gate of PMOS device 1 is cross-coupled to an input of inverter I2 (at N2), and a gate of PMOS device 2 is cross-coupled to an input of inverter I1 (at N1). First and second inputs circuit inputs, A, B, are connected respectively to a source of NMOS devices 3, 5, and to gates of NMOS devices 4, 6. Inverted forms of inputs A, B, identified herein as A', B', are connected respectively to sources of NMOS devices 4, 6, and gates of NMOS devices 3, 5. Outputs of I1, and I2, are the circuit exclusive NOR (XNOR) and exclusive OR (XOR) outputs, respectively.

During normal circuit operation, power dissipation by leakage current is mitigated by cross coupling. Power overhead is nevertheless high in view of the power required to drive the inboard cross coupling, including PMOS devices 1, 2.

Figure 6:
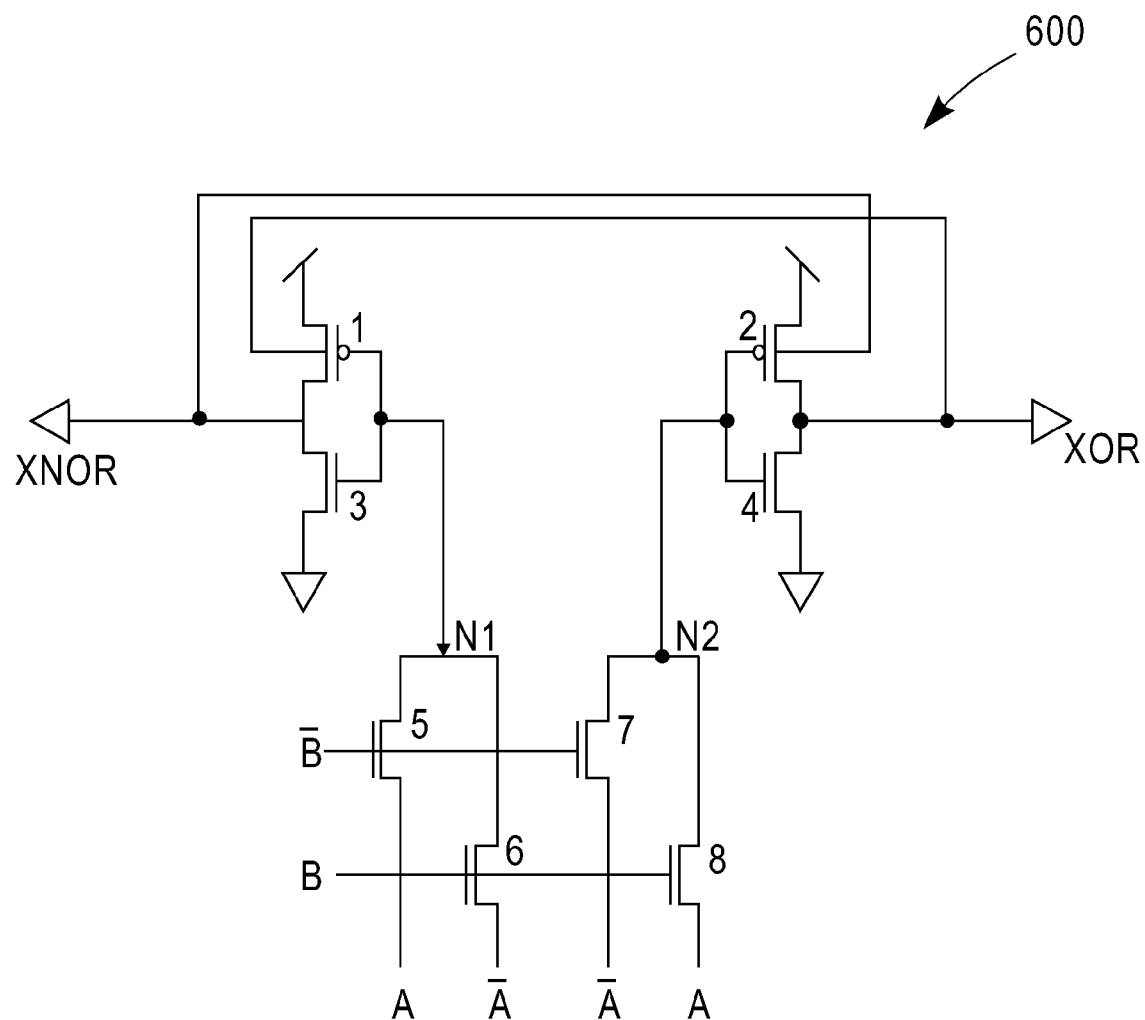
FIG. 6 is a schematic diagram of a novel, back-gated complementary pass-gate logical exclusive NOR/exclusive OR circuit back-gated CMOS in accordance with the invention.

FIG. 6 is a schematic diagram of a novel, back-gated complementary pass-gate logical exclusive NOR/exclusive OR circuit 600 of the invention, constructed with back-gated CMOS in a novel circuit construction by which power dissipation is minimized by the inherent dynamic $V_{Th}$ modulation. Back-gated CPL circuit 600 includes PMOS devices 1, 2, sources of which are connected to Vdd, and drains of which are connected to respective drains of NMOS devices 3, 4. The gate of PMOS device 1 connects to the gate of NMOS device 3 to form a node 1. The gate of PMOS device 2 is connected to NMOS device 4 to form node 2. Node 1 also connects to drains of NMOS devices 5, 6, and node 2 also connects to drains of NMOS devices 7, 8.

An exclusive NOR circuit output is derived from the drains of PMOS device 1 and NMOS device 3, which output is also provided to a back-gate of PMOS device 2. An exclusive OR circuit output is derived from the drains of PMOS device 2 and NMOS device 4, which output is also provided to a back-gate of PMOS device 1. First and second circuit inputs, A, B, are connected respectively to a source of NMOS devices 5, 8, and to gates of NMOS devices 6, 8. Inverted forms of inputs A, B, identified herein as A', B', are connected respectively to sources of NMOS devices 6, 8, and to gates of NMOS devices 5, 7. Coupling the circuit outputs (output voltages) to the back-gates of the load devices in this CPL circuit 600 (PMOS devices 1, 2) reduces power dissipation by dynamic $V_{Th}$ modulation. Alternatively, the evaluate devices could be back-gated with the circuit outputs, whereby instead of a lowered $V_{Th}$ in the load or PMOS devices, the $V_{Th}$ of the NMOS devices would be lowered during normal inventive circuit operation.

The back-gated structure in an evaluate tree dramatically reduces crowbar current when the buffer side is pulled low. Cross-coupling the outputs of circuit 600 onto the back gates of particular circuit devices provides for a dynamic throttling of the circuit's overdrive functioning. The inventive design shows a marked improvement over prior art attempts, which cross-coupled the CPL outputs to the buffer side circuit input, e.g., circuit 500 of FIG. 5.

While it is apparent that the invention herein disclosed is well calculated to fulfill the objects stated above, it will be appreciated that numerous modifications and embodiments may be devised by those skilled in the art and it is intended that the appended claims cover all such modifications and embodiments as fall within the true spirit and scope of the present invention.

The invention claimed is:

1. A complementary pass-gate logical (CPL) XOR/XNOR circuit, comprising:
   first and second PMOS devices, sources of which are connected to Vdd;
   first and second NMOS devices, drains of which are connected to respective drains of the first and second PMOS devices to form respective circuit XNOR and XOR outputs, wherein gates of the first PMOS and first NMOS devices are connected together forming a first node, and wherein the gates of the second PMOS and NMOS devices are connected together forming a second node;
   third and fourth NMOS devices, drains of which are connected respectively to the first node;
   fifth and sixth NMOS devices, drains of which are connected respectively to the second node; and
   A, B circuit inputs, wherein the A circuit input is provide to a source of the third and fifth NMOS devices, the B input is provided to gates of the fourth and sixth NMOS devices, an inverted form of the A input is provided to gates of the fourth and sixth NMOS devices, and an inverted form of the B input is provided to the gates of the third and fifth NMOS devices,
   wherein the XOR and XNOR outputs are connected respectively to back-gates of the first and second PMOS devices to dynamically modulate the threshold voltages of the PMOS devices during normal circuit operation.

2. The complementary pass-gate logical (CPL) XOR/XNOR circuit as set forth in claim 1, further including that the XOR and XNOR outputs are respectively coupled to back-gates of third and fifth NMOS devices, and fourth and sixth NMOS devices, to dynamically modulate the threshold voltage of the NMOS devices during normal circuit operation.

* * * * *